United States Patent
Kim et al.

(10) Patent No.: US 7,352,260 B2
(45) Date of Patent: Apr. 1, 2008

(54) TRANSCEIVER USING LOW TEMPERATURE CO-FIRED CERAMIC METHOD

(75) Inventors: Bong-Su Kim, Daejon (KR); Kwang-Seon Kim, Daejon (KR); Ki-Chan Eun, Daejon (KR); Myung-Sun Song, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 297 days.

(21) Appl. No.: 11/169,089

(22) Filed: Jun. 28, 2005

(65) Prior Publication Data

US 2006/0125575 A1 Jun. 15, 2006

(30) Foreign Application Priority Data

Dec. 10, 2004 (KR) .................. 10-2004-0104178

(51) Int. Cl.
*H01P 3/08* (2006.01)
*H05K 1/16* (2006.01)

(52) U.S. Cl. .................. 333/134; 333/246; 361/761; 361/816

(58) Field of Classification Search .............. 333/134, 333/246, 247; 361/761, 816
See application file for complete search history.

(56) References Cited

U.S. PATENT DOCUMENTS

| | | | |
|---|---|---|---|
| 5,450,046 A | * | 9/1995 | Kosugi et al. .............. 333/246 |
| 5,461,196 A | | 10/1995 | Virga et al. |
| 5,982,250 A | | 11/1999 | Hung et al. |
| 6,387,507 B1 | | 5/2002 | Jones, II et al. |

OTHER PUBLICATIONS

"Small-size 72-GHz-band Transceiver Modules Utilizing IF Self-heterodyne Transmission Technology" Maruhashi et al., 2003 IEEE MTT-S Digest pp. 1045-1048.
"60Hz Ultra Transmitter/Receiver with a Low Phase Noise PLL-Oscillator" Yamada et al., 2003 IEEE MTT-S Digest, pp. 2035-2038.

* cited by examiner

*Primary Examiner*—Robert J. Pascal
*Assistant Examiner*—Kimberly E Glenn
(74) *Attorney, Agent, or Firm*—Ladas & Parry LLP

(57) ABSTRACT

Provided is a microwave and millimeter wave transceiver package technology that can unify the transceiver composed of an amplifier, a filter and a mixer into a low temperature co-fired ceramic (LTCC) module package by using an LTCC method utilizing a multilayer dielectric substrate, thereby achieving miniaturization, a loss reduction and moderate price. The transceiver includes a plurality of cavities arrayed in a multilayer substrate, an amplifier and a mixer mounted in the cavities and a filter provided with a strip line between the amplifier and the mixer.

10 Claims, 5 Drawing Sheets

← 5th VIA PAD
← 4th VIA PAD
← 3rd VIA PAD
← 2nd VIA PAD
← 1st VIA PAD

TRANSCEIVER USING LOW TEMPERATURE CO-FIRED CERAMIC METHOD

FIELD OF THE INVENTION

The present invention relates to a microwave and millimeter wave transceiver package technology that can unify the transceiver composed of an amplifier, a filter and a mixer into a low temperature co-fired ceramic (LTCC) module package by using an LTCC method utilizing a multilayer dielectric substrate, thereby achieving miniaturization, a loss reduction and moderate price.

DESCRIPTION OF RELATED ART

Generally, the most important matter in developing a millimeter wave transceiver system is miniaturization and moderate price. The module package is one of factors that makes it difficult to achieve the miniaturization and moderate price in developing a conventional transceiver system. In particular, precision to tens of micrometers is required to process a device for a package in a microwave and the millimeter wave, which increases the price of the module and a whole system.

The package technology using a conventional LTCC method will be described in detail hereafter.

U.S. Pat. No. 5,461,196 discloses an LTCC package which is composed of a base board, walls on four sides, a central cavity and has a direct current (DC) signal transmitted by forming a strip line in high/low-ranked ground plane and the center, by using a conductive via and a pattern on a wall using a multilayer substrate. It also performs a role of housing to shield a radio frequency signal performed by making the wall plane conductive.

U.S. Pat. No. 6,387,507 discloses a technology using a bonding layer connecting a high temperature co-fired ceramic (HCCC) and a low temperature co-fired ceramic (LTCC) module. The bonding layer is composed of a ground area for heat emission, an aperture for embedding prominent device and a via for connecting signals among carriers.

U.S. Pat. No. 6,387,507 discloses a package device composed of a metal base, a multilayer circuit, a metalling and a metal cover, achieves transition of micro strip-to-a waveguide by using an E-plane probe on top of the multilayer substrate circuit, and extends a waveguide by using a cavity and a via within the multilayer substrate.

An article entitled "60 GHz Ultra Compact Transmitter/Receiver with a Low Phase Noise PLL-Oscillator", *IEEE MTT-S* Vol.3, 2003, discloses a package technology that minimizes the size by embodying a transceiver in one side and an antenna in other side, and makes it easy to connect with a printed circuit board (PCB) without any additional process by embodying a bias power supply and a low frequency signal in the external which is on the top and gathering one direction in a card form.

In an article entitled "Small-size 72-GHz-band transceivers utilizing IF self-heterodyne transmission technology", *IEEE MTT-S* Vol. 2, 2003, the roles of a radio frequency (RF), a ground (GND), and a direct current (DC) are determined in every layer, every active/inactive device is manufactured separately and connected to a multilayer substrate in a flip-chip form, power and an intermediate frequency (IF) signal are connected in a lowest surface through a ball grid array (BGA), and an antenna coupling slot for connecting to the antenna is included.

However, since the conventional package technologies are processes a metal, they occupy a large area in a whole system and the devices of the technologies are heavy, and the cost for manufacturing the devices is high. Since all available input/output ports should be connected by using a connector, a cable loss and a restriction in the arrangement among modules occur in connection with other modules.

SUMMARY OF THE INVENTION

It is, therefore, an object of the present invention proposed to solve the problems of the conventional technology to provide a transceiver package using a low temperature co-fired ceramic a low temperature co-fired ceramic (LTCC) which can increase a density with reduced pattern complexity and be embodied simply and economically.

In accordance with an aspect of the present invention, there is provided a transceiver using a LTCC method having a pad for input/output of a bias on a lowest ground plane in a multilayer substrate, wherein all highest metal layers have a ground plane in a multilayer substrate, and the lowest ground point is connected to the highest ground point in the multilayer substrate through the ground plane of the both side walls, including; a plurality of cavities arrayed in the multilayer substrate; an amplifier and a mixer separately mounted in the cavities; and a filter provided with a strip line between the amplifier and the mixer.

The present invention inserts an amplifier and a mixer microwave monolithic integrated circuit (MMIC) in the inside of a cavity by using an LTCC cavity process and connects the input/out CPW lines by using a bond wire, and the filter is embodied so as to select a desired frequency by using a strip line and a via in the inside of the LTCC. Also, the transition of CPW-to-strip line causing a little loss is used in the filter connection between the amplifier and the mixer. Thus, it is possible to embody the LTCC package where devices can be connected easily and the loss is little.

Also, the simple conductive cover is put on top of the module and the module package including the shielding function can be embodied by having the MMIC and the bias circuit inserted in the inside of the LTCC by using the cavity and positioning the low frequency signal and the bias pad in the lowest ground plane. Since the ground plane which used to exist only in the lowest plane in the conventional method comes to exist in the highest plane and the side wall plane as well, the needed ground plane can be connected to the near place in embodying the LTCC inside circuit, which can reduce the complexity of the ground via and the pattern, and the range of the area which is not used for the strong ground effect and the ground.

Since most of the highest and the lowest plane are printed as a conductor for the ground, curving of the LTCC substrate, which is generated by the asymmetrical up and down pattern of the LTCC substrate in the co-fired process of LTCC, can be reduced remarkably.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
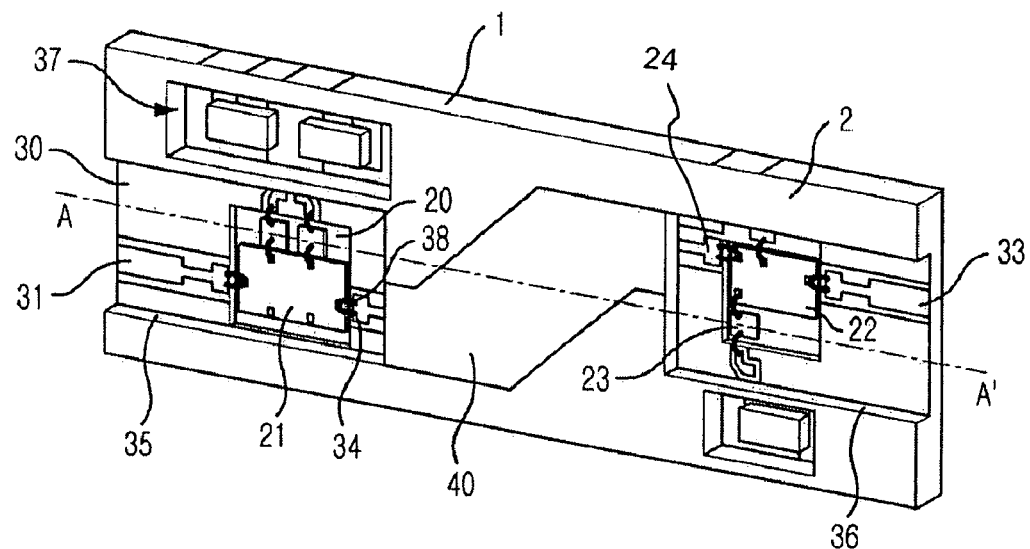
FIG. 1 is a three-dimensional front view showing a transceiver using a low temperature co-fired ceramic (LTCC) in accordance with an embodiment of the present invention.

FIG. 1 is a three-dimensional front view showing a transceiver using a low temperature co-fired ceramic (LTCC) in accordance with an embodiment of the present invention.

Referring to FIG. 1, the transceiver using the LTCC in accordance with an embodiment of the present invention includes a plurality of cavities 35 and 36 arranged in the inside of a multilayer substrate, an amplifier 21 and a mixer 22 of a microwave monolithic integrated circuit (MMIC) form mounted in the inside of the cavities 35 and 36 separately, and a filter 40 having a strip line between the amplifier 21 and the mixer 22.

The transceiver has a pad for input/output of a bias on the lowest ground plane in a multilayer substrate, all highest metal layers have a ground plane 1 on a multilayer substrate, and the lowest ground plane 1 is connected to the highest ground plane through a ground plane of both side walls.

Figure 2:
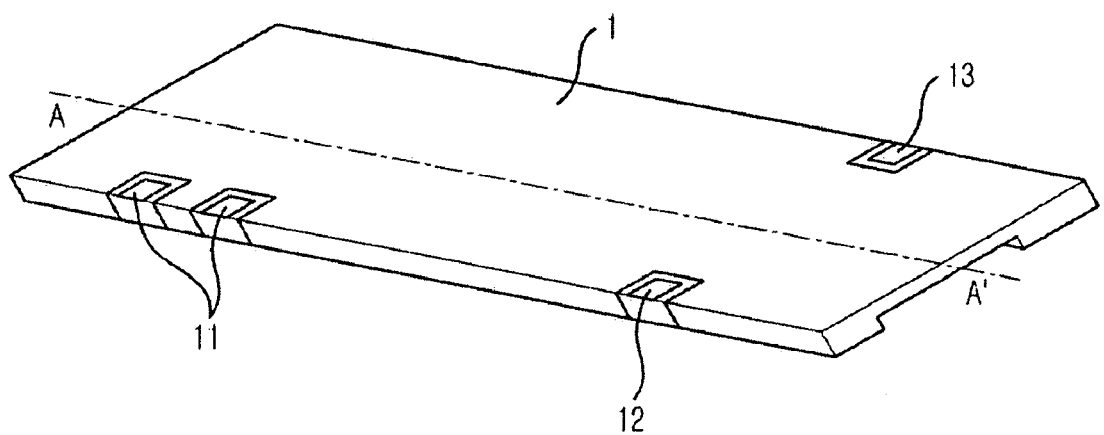
FIG. 2 is a three-dimensional rear view showing a transceiver of FIG. 1.

FIG. 2 is a three-dimensional rear view showing a transceiver of FIG. 1.

As shown in FIGS. 1 and 2, the whole formation is a general transceiver structure including the amplifier 21, the filter 40 and the mixer 22.

There is a microwave and millimeter wave radio frequency (RF) signal input/output port 31 on the left of the transceiver and a local oscillator (LO) input port 33 for up/down-converting a frequency on the right of the transceiver. These ports may be implemented in the forms of a coplanar waveguide (CPW) line and a micro strip line to make a connection through the transceiver and a bond wire 38, a pad form for connecting through a bumper or a ball as shown in FIG. 2 or a connector form on the lowest ground plane 1.

In the lowest ground plane 1, there are an amplifier bias pad 11 and a mixer bias pad 12 for power supply, and an intermediate frequency (IF) signal input/output pad 13 having a relatively low frequency. The IF signal input/output pad 13 can also use the bond wire 38 and the connector, just as a radio frequency signal.

The closer the mounted position of the amplifier 21 and the flat capacitor 23 is from the lowest ground plane 1 for a heat emission and an efficient ground of MMIC form amplifier 21, the better it is, and there are the cavity 35 of the amplifier and the cavity 36 of the mixer.

The cavity 35 of the amplifier and the cavity 36 of the mixer are positioned in the conductive layer 20 on top of the $2^{nd}$ layer substrate according to the design rule of a LTCC method in accordance with the present invention.

Also, a short bond wire 38 of about 200 μm to 300 μm is the most important in order not to deteriorate the performance of the MMIC in mounting a microwave and millimeter wave MMIC. Considering that the general thickness of the amplifier 21 and the mixer 22 is about 100 μm, the input/output impedance matching circuit 34 with respect to an inductance element of two bond wires 38 is formed in the conductive layer 30 on the top of the $3^{rd}$ layer substrate having a similar height to the heights of the amplifier 21 and the mixer 22.

The input/output impedance matching circuit 34 basically follows the form of L-C-L and is connected to the radio frequency signal input/output port 31, the LO input port 33, and a filter input/output strip line 57 directly. The bias circuit for power supply of MMIC is connected through a bond wire 38 from a power pad of MMIC to the flat capacitor 23 and from the flat capacitor 23 to the bias pad existing on the top of the $3^{rd}$ layer substrate conductive layer 30, and through the line formed in the inside of the multilayer substrate to the lowest ground plane 1.

Generally, in the structure such as a high power amplifier having a complicated bias circuit, a multilayer technology is advantageous in miniaturizing and moderating a price since it reduces the complexity of the bias circuit and increases the whole circuit density. Also, the chip is mounted in the inside of the module by using the cavity 37 for a chip capacity in order to close the conductor cover for shielding the module of the highest ground plane.

Figure 3:
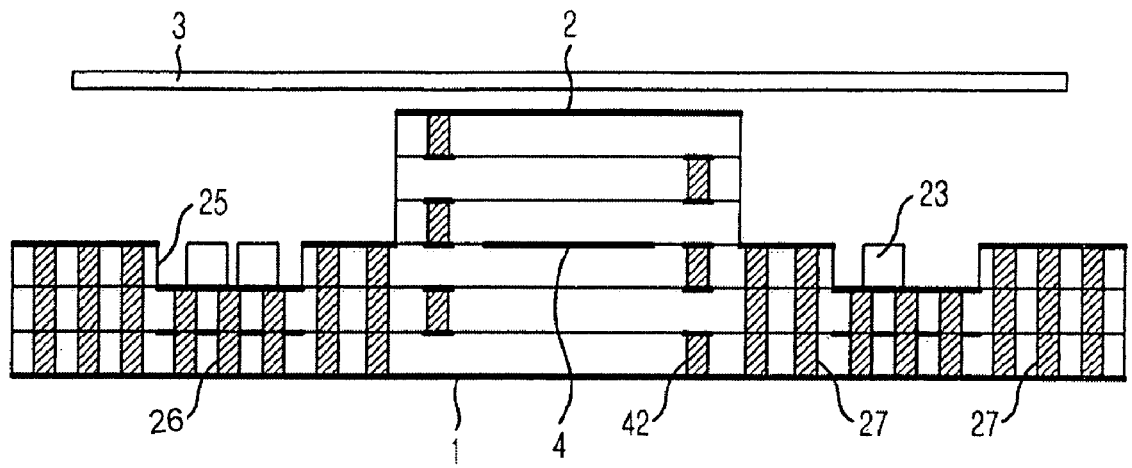
FIG. 3 is a cross-sectional view obtained by cutting the transceiver of FIGS. 1 and 2 in the direction of A to A'.

FIG. 3 is a cross-sectional view obtained by cutting the transceiver of FIGS. 1 and 2 in the direction of A to A'.

Referring to FIG. 3, the $3^{rd}$ layer CPW line and the ground via 27 for the CPW line ground plane are used to transmit the radio frequency and the local oscillator signal. The cavity 25 for mounting the MMIC of the $2^{nd}$ layer exists and the ground via 26 for emitting the heat generated in the MMIC and giving a ground effect is used as dense as possible.

Also, the band-pass filter 40 having the strip line 4 formed in the shape of the $6^{th}$ layer is positioned in the center, the ground plane uses the lowest ground plane 1 and the highest ground plane 2. A ground via 42 exists along the boundary of the filter to prevent signal leakage and the effect of ground. Also, the conductor cover 3 is positioned in the highest ground plane 2 of the transceiver embodied in multilayers for shield and powerful ground. The conductor cover 3 is connected to the lowest ground plane 1 by printing a metal device or a conductive material to the side planes.

Figure 4:
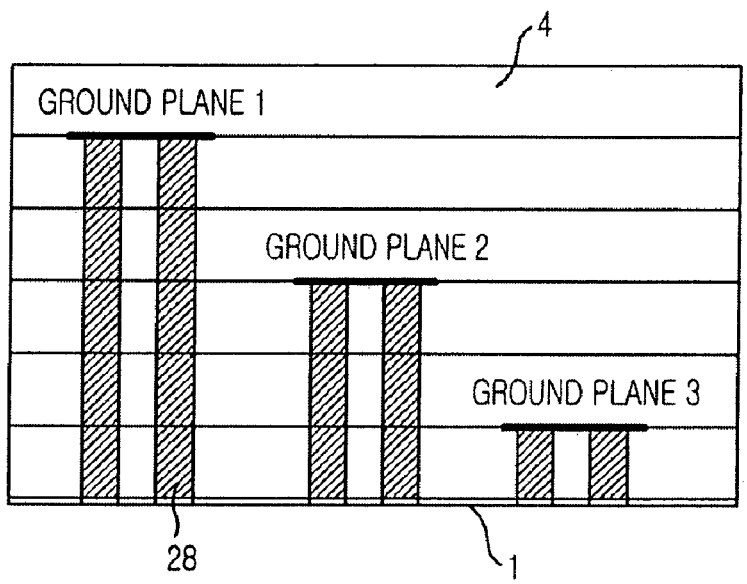
FIG. 4 is a view showing a connecting method of the multilayer substrate ground plane in accordance with the conventional method.
Figure 5:
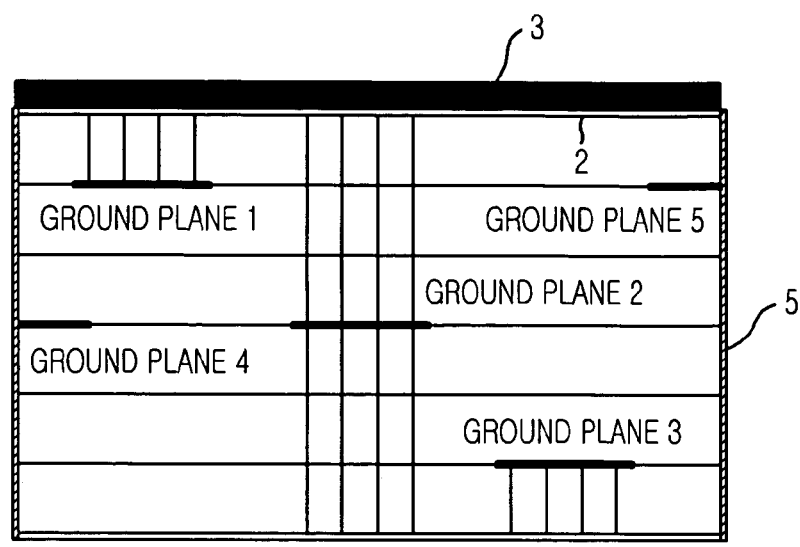
FIG. 5 is a plane view showing a connecting method of the multilayer substrate ground plane in accordance with the present invention.

FIG. 4 is a plane view showing a connecting method of the multilayer substrate ground plane in accordance with the conventional method and FIG. 5 is a plane view showing a connecting method of the multilayer substrate ground plane in accordance with the present invention.

FIG. 4 is a structure using only the lowest ground plane 1, and FIG. 5 is a structure using the lowest ground plane 1, the highest ground plane 2 and the conductor cover 3 together.

As shown in FIG. 4, the structure using the lowest ground plane 1 needs to raise the ground as many as the dielectric layers 4 by using a ground via 28 from the lowest ground plane 1 to the ground plane regardless of the position of the ground plane. The higher the ground plane gets, the lower the effect of ground is. The more the number of the used ground via is. Since the ground via 28 can not be used for other purposes, it is difficult to achieve miniaturization which is an advantage of the multilayer substrate.

Meanwhile, as shown in FIG. 5, if the ground is used in the ground planes 2 and 1 of the upper and lower, the powerful ground effect can be obtained by using the ground of the nearer side, the number of the ground via 28 decreases and the range used by the ground via 28 can be reduced. As the ground plane is extended more and metal material or conductive material on the wall plane of both sides is printed, the ground plane located close to the wall plane can provide the ground effect by using ground planes 5 on both side walls without using the via.

Figure 6:
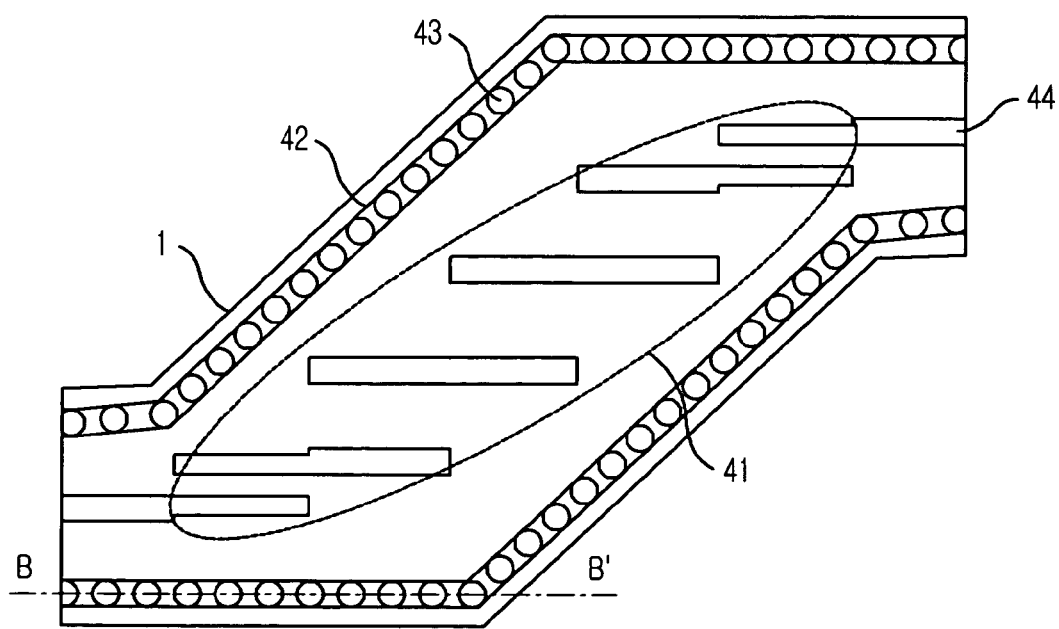
FIG. 6 is a plane view illustrating the band-pass filter of FIG. 1.

FIG. 6 is a plane view illustrating a band-pass filter of FIG. 1.

FIG. 6 shows the band-pass filter 40 embodied in the form of a plurality of strip lines 41 which are coupled in a general row and the filter selects a desired frequency by positioning between the amplifier 21 and the mixer 22.

For the prevention of the signal leakage and the effect of the ground, the via of total 6 layers is positioned around the filter 40. In case that the via of the 6 layers is filed in a row, the part that via exists is swollen. Since the millimeter wave can cause the movement of the high frequency and the change of the performance by the little change of the various parameters forming a filter, the flatness of the filter needs to be improved and, accordingly, the ground via 43 arranged cross each other is used. Also, the via pad 42 is inserted into the $1^{st}$, $2^{nd}$, $3^{rd}$, $4^{th}$ and $5^{th}$ conductive layers in order to connect the ground vias 43 positioned between the layers.

Figure 7:
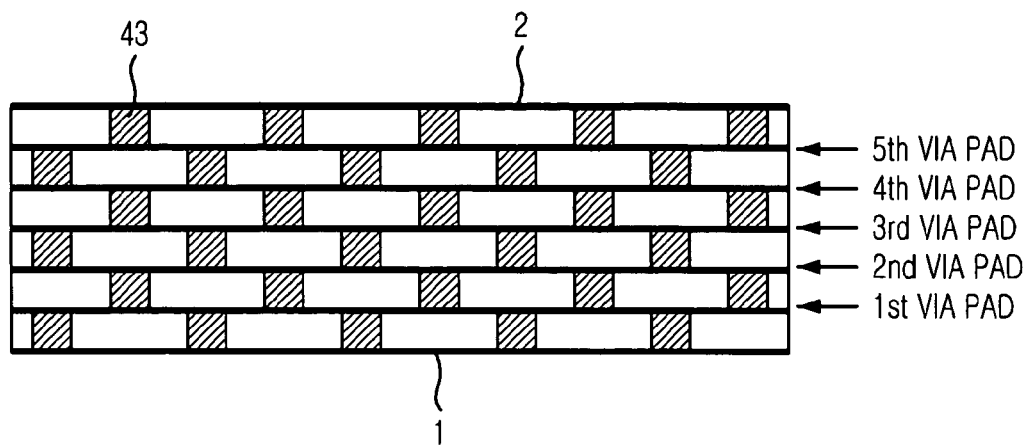
FIG. 7 is a cross-sectional view obtained by cutting the filter of FIG. 6 in the direction of B to B'.

FIG. 7 is a cross-sectional view obtained by cutting the filter of FIG. 6 in the direction of B to B' and shows that the ground via 43 is arranged crossly.

Figure 8:
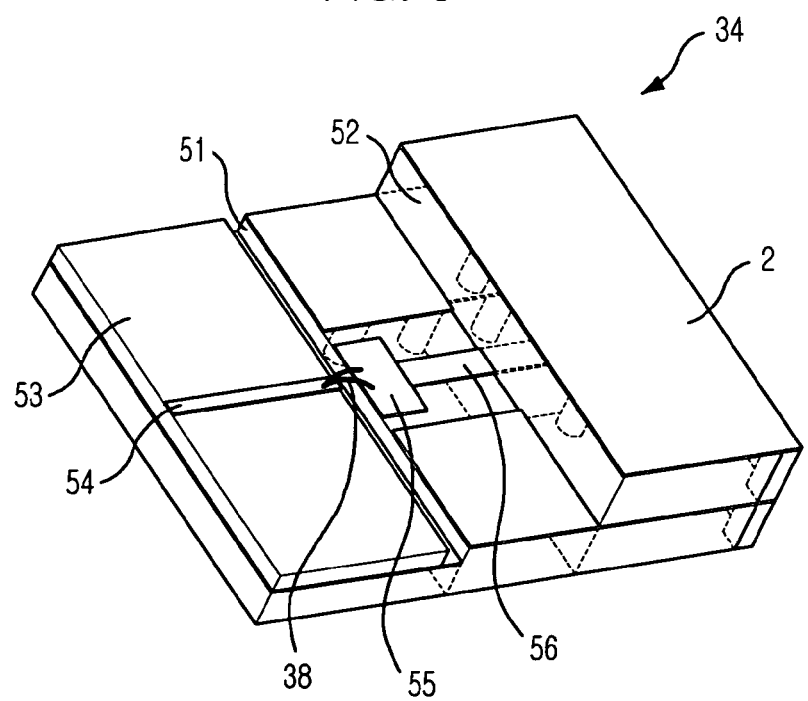
FIG. 8 is a three-dimensional front view showing a multilayer substrate transition in accordance with the present invention.
Figure 9:
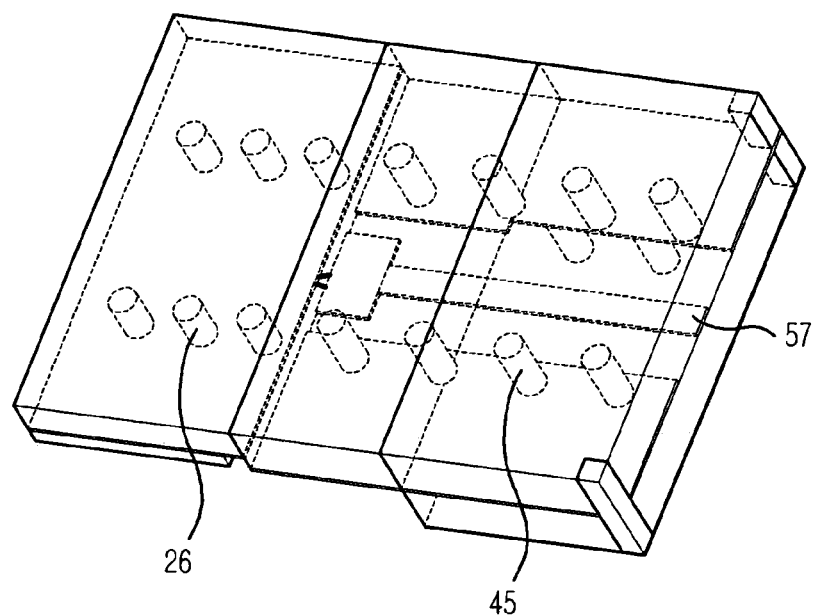
FIG. 9 is a three-dimensional rear view showing the multilayer substrate transition in accordance with the present invention.

FIG. 8 is a three-dimensional front view showing a multilayer substrate transition in accordance with the present invention, and FIG. 9 is a three-dimensional rear view showing the multilayer substrate transition in accordance with the present invention.

FIGS. 8 and 9 show structures for removing the inductance element generated in the bond wire 38 for connecting MMIC, i.e., the amplifier 21 and the mixer 22 by using the matching circuit 34 of the multilayer substrate.

To keep the heights of the pad and the matching circuit 34 similar on the MMIC, a $1^{st}$ layer cavity 51 is used in the position that the MMIC is mounted, and the length of the bond wire 38 is kept short. In case of the MMIC processing in a millimeter wave, one bond wire 38 has a limit in forming a matching circuit since it generates much inductance. Therefore, the inductance element needs to be reduced by using two bond wires 38.

The ground plane and a parallel capacitance 55 are formed by using a large area pattern to realize the matching circuit 34 of the L-C-L form and the element of a serial inductance 56 is embodied by using a line with a narrow linewidth.

By connecting the matching circuit 34 to the filter input/output strip line 57 directly, the connection between devices can be shortened and the transmission loss by the bond wire 38 can be reduced.

Figure 10:
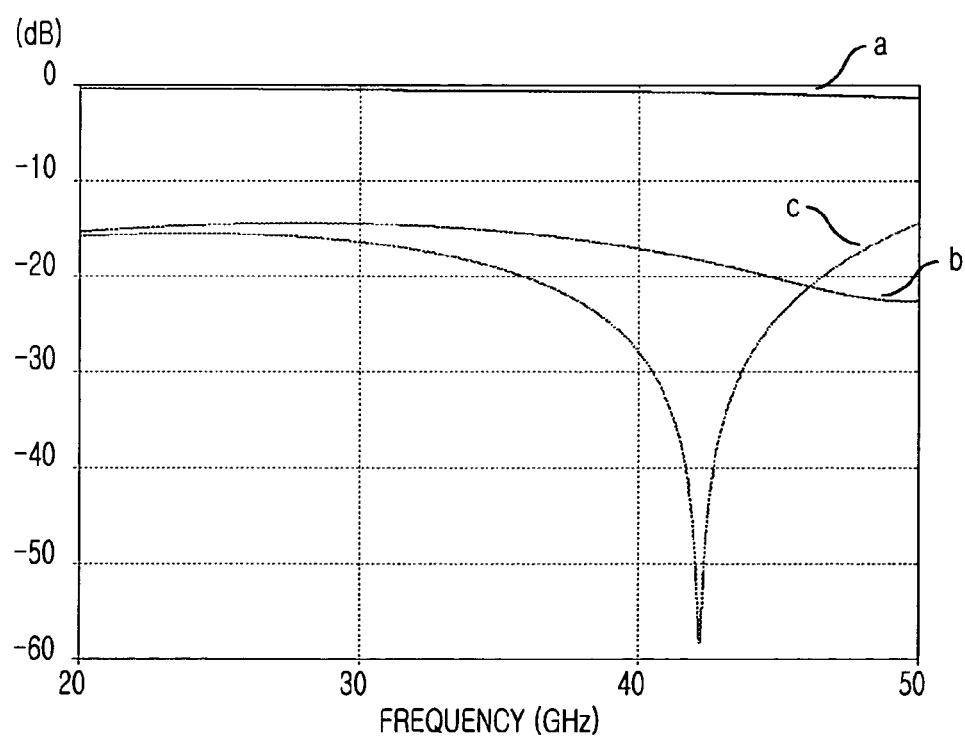
FIG. 10 is a graph showing the simulation result of the multilayer substrate transition of FIG. 8.

FIG. 10 is a graph showing the simulation result of the multilayer substrate transition of FIG. 8.

A horizontal axis is the frequency of a GHz unit and a vertical axis is the S-parameter size of a dB unit.

A graph line 'a' shows an insertion loss S12 and S21 from a 1 port to a 2 port or from a 2 port to a 1 port. Since S12 and S21 have a similar value, they can be shown by a graph line 'a'. As shown in the graph line 'a', it can be seen that the insertion loss is not more than 1 dB at 40 GHz.

A graph line 'b' shows the insertion loss from the 1 port to the 1 port, i.e., a return loss S11, and a graph line 'c' shows an insertion loss from the 2 port to the 2 port, i.e., a return loss S22.

In case of the insertion loss shown in the graph lines 'b' and 'c', the larger the value gets in minus, the better it is and it can be seen that the insertion loss is not more than −17 dB in FIG. 10.

As described in the above, the present invention can embody the integrated transceiver by using various technologies of the multilayer substrate, reduce the complexity of the ground via and the transmission line pattern by using the lowest ground plane, the highest ground plane, and both side walls as a standard ground and improve the performance of the whole module by using a near ground.

Also, it is possible to embody a circuit of a higher density since many parts used for the ground can be used to form of the circuit. The present invention can be embodied simply at a low cost by mounting all expensive package devices, which are manufactured by processing metal conventionally, in the inside by the use of a multilayer substrate cavity, and closing the cavity with a metal cover. It is also possible to reduce curving caused in the LTCC co-fired process by making the conductive layer rate of the lowest plane and the highest plane similar to each other. In the strip line filter, a total of 6 layers of via are arranged crossing each other following around the filter for the prevention of the signal leakage and the ground effect, which can reduce the insertion loss and improve the flatness of the filter.

Also, it can be shown in the embodiments that the influence of the bond wire is compensated for and the connection between devices can be shortened by using the impedance matching and the line transition structure which are connected to the bond wire 38, the flat capacitor 23, the flat inductor 24 and the strip line 4.

As described in the above, the present invention can reduce the complexity of the transceiver pattern using the LTCC, increase the density and it can be realized simply at a low cost, which can improve the performance of the transceiver using the LTCC and make a price competitive.

The present application contains object matter related to Korean patent application No. 2004-0104178, filed in the Korean Intellectual Property Office on Dec. 10, 2004, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A transceiver using a low temperature co-fired ceramic (LTCC) method, comprising:
   a multilayer substrate including:
      a lowest ground plane;

a highest ground plane;
a plurality of interior ground planes;
a plurality of dielectric layers sandwiched between all of the ground planes;
a plurality of ground side walls connecting together the lowest ground plane to the highest ground plane; and
a pad for input/output of a bias on a lowest ground plane;
a plurality of ground vias interconnecting together all of the ground planes of the multilayer substrate;
an amplifier mounted to the multilayer substrate within a cavity;
a mixer mounted onto the multilayer substrate within another cavity; and
a filter mounted onto the multilayer substrate, the filter having a strip line between the amplifier and the mixer.

2. The transceiver as recited in claim 1, wherein the mixer and the amplifier are in the type of a monolithic microwave integrated circuit (MMIC).

3. The transceiver as recited in claim 2, further comprising
an impedance matching circuit which is connected to the amplifier through a bond wire;
a flat capacitor is attached to the mixer; and
a flat inductor is directly connected to a strip line at a substantially same layer in order to compensate the bond wire used to mount the MMIC.

4. The transceiver as recited in claim 1, further comprising wherein a plate-type metal cap attached to the highest ground plane.

5. The transceiver as recited in claim 1, wherein the interior ground planes positioned in the multilayer substrate are connected to adjacent ground planes through ground vias wherein each of the interior ground planes are connected to the lowest ground plane through the ground vias.

6. The transceiver as recited in claim 1, wherein the filter is a band pass filter.

7. The transceiver as recited in claim 1, wherein a some of the ground vias are placed around sides of the filter for a leakage wave prevention of the filter and a ground effect.

8. The transceiver as recited in claim 7, wherein some of the ground vias are positioned around the filter in a row or by crossing each other.

9. The transceiver as recited in claim 7, further comprising a plurality of via pads are placed within the multilayer structure.

10. The transceiver as recited in claim 1, wherein an input/output port of the transceiver is an external coplanar waveguide (CPW) line, a micro strip, a pad and a connector located on the lowest ground plane.

* * * * *